(12) United States Patent  (10) Patent No.: US 8,886,141 B2
Nakane et al.  (45) Date of Patent: Nov. 11, 2014

(54) SEMICONDUCTOR DEVICE AND ADJUSTMENT METHOD THEREFOR

(71) Applicant: RENESAS Electronics Corporation, Kawasaki (JP)

(72) Inventors: Hideo Nakane, Kawasaki (JP); Keisuke Kimura, Kawasaki (JP); Takaya Yamamoto, Kawasaki (JP); Tatsuji Matsuura, Kawasaki (JP); Ryuichi Ujiie, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/657,765

(22) Filed: Oct. 22, 2012

(65) Prior Publication Data

US 2013/0102264 A1 Apr. 25, 2013

(30) Foreign Application Priority Data

Oct. 25, 2011 (JP) ................................. 2011-233722

(51) Int. Cl.
*H04B 17/02* (2006.01)
*H03M 1/10* (2006.01)
*H04B 1/10* (2006.01)

(52) U.S. Cl.
CPC .......... *H03M 1/1004* (2013.01); *H03M 1/1009* (2013.01); *H04B 1/1027* (2013.01)
USPC ............. 455/136; 455/91; 455/130; 455/142; 455/164.2; 455/333; 327/175

(58) Field of Classification Search
CPC .................................................... H03M 1/1009
USPC ................ 455/136, 333, 91, 130, 142, 164.2; 327/175
See application file for complete search history.

(56) References Cited

U.S. PATENT DOCUMENTS

| 6,134,282 | A | * | 10/2000 | Ben-Efraim et al. | ......... 375/350 |
| 6,154,510 | A | * | 11/2000 | Cochran et al. | ............... 375/371 |
| 7,046,179 | B1 |  | 5/2006 | Taft et al. | |
| 7,120,427 | B1 | * | 10/2006 | Adams et al. | ................. 455/418 |
| 7,496,161 | B2 | * | 2/2009 | Chou et al. | ..................... 375/344 |
| 7,623,050 | B2 |  | 11/2009 | Le et al. | |
| 7,843,369 | B2 |  | 11/2010 | Takahashi et al. | |
| 8,004,331 | B2 | * | 8/2011 | Li et al. | ......................... 327/175 |
| 8,040,263 | B2 |  | 10/2011 | Nakajima | |
| 8,140,045 | B2 | * | 3/2012 | Kurokawa et al. | ............ 455/333 |
| 2010/0135100 | A1 | * | 6/2010 | Chiu | ........................ 365/233.11 |
| 2010/0239049 | A1 |  | 9/2010 | Horisaki | |

FOREIGN PATENT DOCUMENTS

| JP | 2009-159415 A | 7/2009 |
| JP | 2010-004373 A | 1/2010 |
| JP | 2010-035140 A | 2/2010 |
| JP | 2010-226236 A | 10/2010 |

\* cited by examiner

*Primary Examiner* — Sanh Phu

(74) *Attorney, Agent, or Firm* — McGinn IP Law Group, PLLC

(57) ABSTRACT

Provided is a semiconductor device that is capable of performing background calibration during a reception operation without adversely affecting reception characteristics. During a reception operation, the semiconductor device detects a timing at which an invalid received signal occurs upon a gain change or a reception channel change and performs background calibration at the detected timing. In this instance, as the received signal is invalid, performing the calibration does not further decrease the substantial accuracy of reception. Moreover, an unnecessary signal component, which would arise when the background calibration is performed at fixed intervals, will not be generated as far as the background calibration is performed at random timing.

19 Claims, 10 Drawing Sheets

SEMICONDUCTOR DEVICE AND ADJUSTMENT METHOD THEREFOR

CROSS-REFERENCE TO RELATED APPLICATIONS

The disclosure of Japanese Patent Application No. 2011-233722 filed on Oct. 25, 2011 including the specification, drawings, and abstract is incorporated herein by reference in its entirety.

BACKGROUND

The present invention relates to a semiconductor device and an adjustment method for the semiconductor device. More particularly, the present invention relates to a semiconductor device used for wireless communication and an adjustment method for such a semiconductor device.

A miniaturized CMOS (Complementary Metal Oxide Semiconductor) process is increasingly used even for an RF (Radio Frequency) IC (Integrated Circuit) such as a wireless communication LSI (Large Scale Integration) circuit. It is demanded that signal processing be performed in the miniaturized CMOS process with higher accuracy than in a related-art semiconductor manufacturing process. However, the miniaturized CMOS process is inferior in analog characteristics to the related-art semiconductor manufacturing process. It is therefore important to use a method of, for example, performing calibration after manufacture to improve the characteristics of a manufactured semiconductor device.

In a currently available RFIC, an interface for communicating with an LSI circuit, which performs baseband processing, is digitized. Therefore, the RFIC has a built-in ADC (Analog-to-Digital Converter) that receives an analog signal from an antenna and converts the analog signal to its digital equivalent. It is necessary that the ADC be also calibrated to meet desired conditions for characteristics.

However, when, for instance, W-CDMA (Wideband Code Division Multiple Access) or LTE (Long Term Evolution) is used as a communication method, it is necessary to continuously operate a receiver circuit. Therefore, off-line calibration cannot be performed because it has to be performed during a non-operating period. Further, if background calibration, which is to be performed during an operation, is periodically performed, an unnecessary signal component having a frequency corresponding to the cycle of such calibration is generated to decrease the accuracy of a received signal.

In view of the above, an analog-to-digital conversion circuit is disclosed in U.S. Pat. No. 7,046,179. The analog-to-digital conversion circuit has a multiplexer and performs foreground calibration by switching between an input signal and a reference signal. More specifically, the analog-to-digital conversion circuit includes a calibration reference circuit and a conversion circuit. The calibration reference circuit is formed in an integrated circuit to supply a calibration reference signal. The conversion circuit is formed in an integrated circuit to include a comparison reference circuit and a comparison circuit. The comparison reference circuit supplies a plurality of reference signals. The comparison circuit supplies a plurality of comparator output signals, which correspond to the reference signals, and a comparator input signal. The comparator input signal is generated from the calibration reference signal when a calibration signal is presented. The calibration reference circuit is formed as described below. When the calibration signal is presented, the calibration reference circuit is enabled. When, on the other hand, the calibration signal is not presented, the calibration reference circuit is disabled and does not substantially consume any electrical power.

Another analog-to-digital conversion circuit is disclosed in U.S. Pat. No. 7,623,050. The analog-to-digital conversion circuit fine-tunes a reference voltage to perform foreground calibration of the offset voltage of a comparator used in the analog-to-digital conversion circuit. More specifically, the analog-to-digital conversion circuit includes an analog-to-digital converter, a multiplexer, a variable voltage source, and a calibration circuit. The analog-to-digital converter includes a first input section, a second input section, and an output section. The multiplexer is coupled to the first input section of the analog-to-digital converter. The variable voltage source is coupled to the second input section of the analog-to-digital converter. The calibration circuit controls the variable voltage source and is coupled between the variable voltage source and the output section of the analog-to-digital converter. The analog-to-digital converter compares a fixed voltage supplied through the multiplexer to a variable voltage supplied from the variable voltage source.

An analog-to-digital converter is disclosed in Japanese Unexamined Patent Publication No. 2009-159415. The analog-to-digital converter performs foreground calibration of a reception system by using a transmitter circuit. More specifically, the analog-to-digital converter is used for a receiver circuit of a communication device to perform calibration with a digital signal. The analog-to-digital converter includes an analog-to-digital conversion unit, a calibration section, a digital output generation section, and a selector switch. The analog-to-digital conversion unit converts an input analog signal to a digital signal. The calibration section is coupled to the output side of the analog-to-digital conversion unit. An output of the analog-to-digital conversion unit is input into the digital output generation section. The selector switch is provided on the input side of the analog-to-digital conversion unit. The selector switch is capable of inputting into the analog-to-digital conversion unit either an analog signal input into the receiver circuit or a calibration analog signal obtained when a calibration digital signal is subjected to digital-to-analog conversion in a digital-to-analog converter for the transmitter circuit of the communication device. The calibration section is coupled to the output of the digital output generation section, to the output of the analog-to-digital conversion unit, and to the input of the digital-to-analog converter. The calibration section is capable of acquiring a parameter for calibrating the output of the analog-to-digital conversion unit by using the calibration digital signal and a digital signal obtained when the calibration analog signal is input into the analog-to-digital conversion unit.

Another analog-to-digital converter is disclosed in Japanese Unexamined Patent Publication No. 2010-004373. The analog-to-digital converter is a serial-parallel converter that performs background calibration. More specifically, the analog-to-digital converter includes a reference voltage generation circuit, a high-order bit comparator, a plurality of amplifiers, a plurality of first selectors, a plurality of second selectors, a plurality of low-order bit comparators, a third selector, and an encoder. The reference voltage generation circuit generates a plurality of reference voltages. The high-order bit comparator divides the reference voltages into a plurality of regions, notes the divided regions, and compares the input analog voltage to a region boundary voltage to determine a region to which an input analog voltage belongs. The amplifiers output a difference voltage between the reference voltages and the input analog voltage. The first selectors select the reference voltages to be input into the amplifiers.

The second selectors check the output signals of the amplifiers in the divided regions and select the output signals of the amplifiers in accordance with the region determined by the high-order bit comparator. The low-order bit comparators compare the magnitudes of two signals out of the signals selected by the second selectors to output a comparison result signal. The third selector checks the low-order bit comparators, selects the output signal of a low-order bit comparator for analog-to-digital conversion, and does not select the output signal of a low-order bit comparator for calibration. The encoder generates a digital signal in accordance with the output signal of the low-order bit comparator selected by the third selector and with the region determined by the high-order bit comparator.

A power consumption control method for a wireless receiver is disclosed in Japanese Unexamined Patent Publication No. 2010-226236. The wireless receiver is configured so that an analog-to-digital conversion section for digitizing a received signal, which is downconverted in a high-frequency section, and entering the digitized received signal into a baseband section, is capable of setting a bias current. The power consumption control method includes the following first and second steps. The first step determines, in accordance with a digital signal output from the analog-to-digital conversion section, whether a first change or a second change occurs. In the first change, the status changes from a communication signal reception state to a communication signal wait state. In the second change, the status changes from the communication signal wait state to the communication signal reception state. The second step is performed in accordance with the result of determination. More specifically, when the first change occurs, the second step sets a smaller bias current than when the second change occurs. When, on the other hand, the second change occurs, the second step sets a larger bias current than when the first change occurs.

Still another analog-to-digital converter is disclosed in Japanese Unexamined Patent Publication No. 2010-035140. The analog-to-digital converter compares converted values by using two comparators and performs calibration by updating an offset. More specifically, the analog-to-digital converter includes a reference voltage generation circuit, a first comparator, a second comparator, and a calibration circuit. The reference voltage generation circuit outputs a reference voltage. The first and second comparators compare the voltage of an input signal to the reference voltage and output a digital signal indicative of a first logic value or a second logic value. The calibration circuit compares the output of the first comparator to the output of the second comparator and outputs a first offset control signal and a second offset control signal. The first comparator sets a positive or negative offset amount for an output inversion threshold value level in accordance with the first offset control signal. The second comparator sets an offset amount for the output inversion threshold value level in accordance with the second offset control signal. The offset amount set by the second comparator has an inverse polarity with respect to the offset amount set by the first comparator.

SUMMARY

A related-art AD conversion (analog-to-digital conversion) method cannot simultaneously perform an ADC operation and a background calibration operation. Even when it simultaneously performs the above operations, they are not suitable for communication purposes. The reason is that reception quality deteriorates when calibration is periodically performed by a circuit with a built-in reception system. This problem is noticeable particularly when W-CDMA or other similar communication method is employed so that a reception state persists. When a comparator is periodically calibrated, an unnecessary spurious signal is generated by a harmonic having a fundamental wave equivalent to such periodicity. This results in the deterioration of reception characteristics.

Further, when a redundant AD conversion method or other similar method that does not perform calibration is employed, the speed of AD conversion decreases although calibration need not be performed. This causes a problem for communication to which high-speed operations are essential. For example, when successive approximation AD conversion is performed, its speed decreases because the number of comparisons required for conversion is increased. When pipeline AD conversion is performed, its speed decreases because the number of pipeline steps is increased.

Means for solving the problem will now be described by using reference numerals used under "DETAILED DESCRIPTION". The reference numerals are added to clarify the correspondence between "WHAT IS CLAIMED IS" and "DETAILED DESCRIPTION". However, the reference numerals should not be used to interpret the technical scope of the present invention, which is defined under "WHAT IS CLAIMED IS".

A semiconductor device (1, etc.) provided by the present invention includes a communication circuit section (10, 20, 30, 40, etc.), a detection circuit section (64, etc.), and an adjustment circuit section (300, etc.). The communication circuit section (10, 20, 30, 40, etc.) performs a reception operation. The detection circuit section (64, etc.) detects the occurrence of an invalid received signal during the reception operation. The adjustment circuit section (300, etc.) adjusts the characteristics of the communication circuit section (10, 20, 30, 40, etc.). The adjustment circuit section (300, etc.) makes the adjustment at a timing at which the invalid received signal occurs.

A semiconductor device adjustment method provided by the present invention includes the steps of: causing the communication circuit section (10, 20, 30, 40, etc.) to perform a reception operation; detecting the occurrence of an invalid received signal during the reception operation; and adjusting the characteristics of the communication circuit section (10, 20, 30, 40, etc.). The step of adjusting includes the step of making the adjustment at a timing at which the invalid received signal occurs.

The semiconductor device provided by the present invention and the adjustment method for the semiconductor device make it possible to calibrate the analog characteristics of the semiconductor device for the purpose of obtaining good reception characteristics.

BRIEF DESCRIPTION OF THE DRAWINGS

Embodiments of the present invention will be described in detail based on the following figures, in which.

DETAILED DESCRIPTION

A semiconductor device provided by the present invention and an adjustment method for the semiconductor device will be described below with reference to the accompanying drawings.

First Embodiment

Figure 1A:
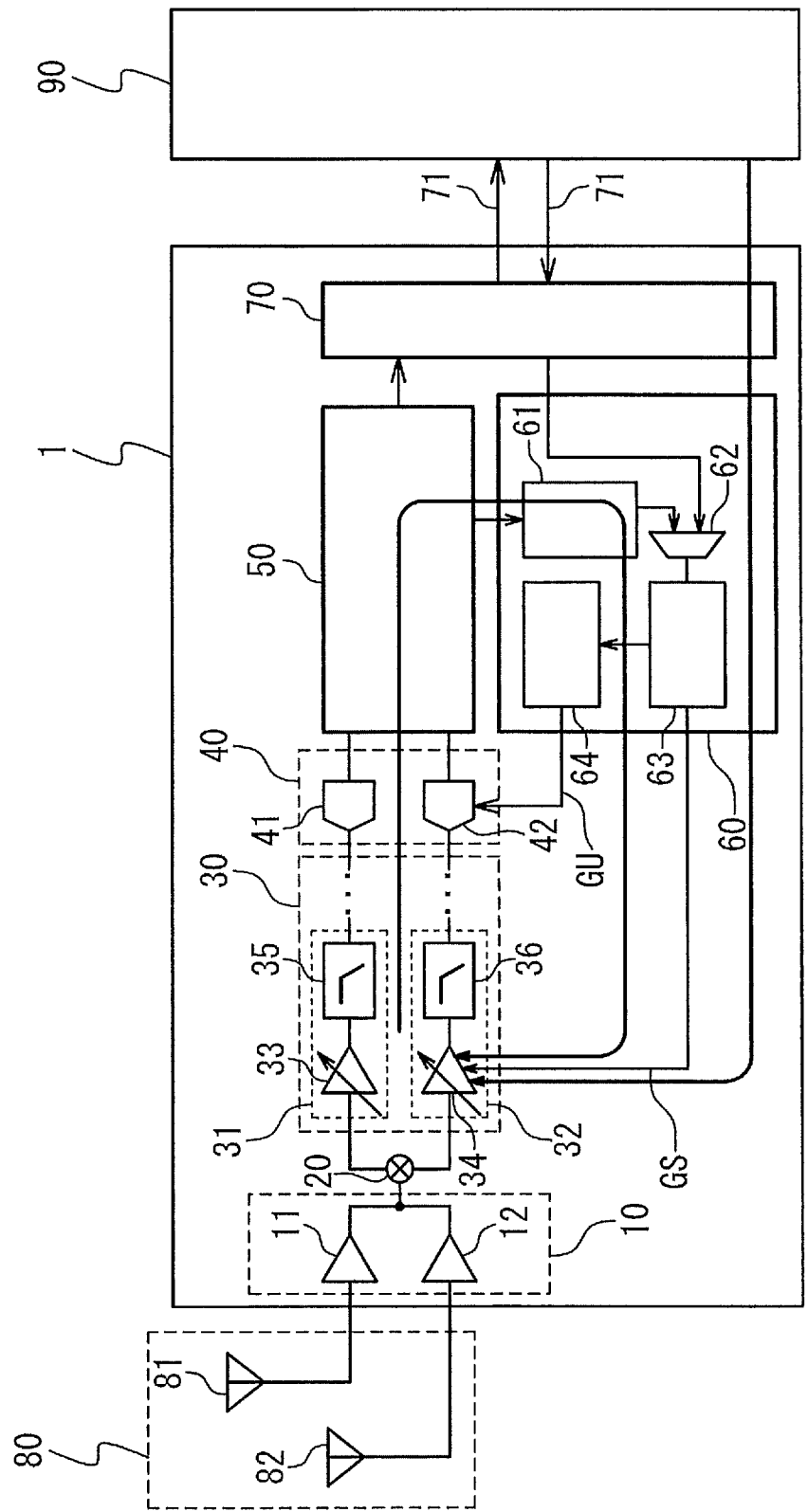
FIG. 1A is a block circuit diagram illustrating the overall configuration of a semiconductor device according to a first embodiment of the present invention.

FIG. 1A is a block circuit diagram illustrating the overall configuration of a semiconductor device 1 according to a first embodiment of the present invention. Structural elements of the semiconductor device shown in FIG. 1A will now be described. The semiconductor device 1 shown in FIG. 1A includes an LNA (Low Noise Amplifier) section 10, a mixer 20, a filter section 30, an ADC section 40, a back-end logic circuit section 50, a control logic circuit section 60, and an interface section 70.

The LNA section 10 includes a first LNA 11 and a second LNA 12. The filter section 30 includes a first filter circuit 31 and a second filter circuit 32. The first filter circuit 31 includes a first PGA (Programmable Gain Amplifier) 33 and a first filter 35. The second filter circuit 32 includes a second PGA 34 and a second filter 36. The ADC section 40 includes a first ADC 41 and a second ADC 42. A plurality of units of these PGAs and filter circuits may be coupled as needed to provide desired characteristics. The control logic circuit section 60 includes an amplitude detector 61, a selector 62, a gain control logic circuit section 63, and a gain update signal generation logic circuit section 64.

Couplings between the structural elements of the semiconductor device 1 shown in FIG. 1A will now be described. The input section of the first LNA 11 is coupled to a first antenna 71, which is included in an antenna section 80 external to the semiconductor device 1. The input section of the second LNA 12 is coupled to a second antenna 82, which is included in the antenna section 80. The output section of the first LNA 11 and the output section of the second LNA 12 are coupled to the input section of the mixer 20. A first output section of the mixer 20 is coupled to a first input section of the first PGA 33. A second output section of the mixer 20 is coupled to a first input section of the second PGA 34. The output section of the first PGA 33 is coupled to the input section of the first filter 35. The output section of the second PGA 34 is coupled to the input section of the second filter 36. A first input section of the first ADC 41 is coupled downstream of the first filter 35. A first input section of the second ADC 42 is coupled downstream of the second filter 36. The output section of the first ADC 41 is coupled to a first input section of the back-end logic circuit section 50. The output section of the second ADC 42 is coupled to a second input section of the back-end logic circuit section 50. A first output section of the gain control logic circuit section 63 is coupled to a second input section of the first PGA 33. A second output section of the gain control logic circuit section 63 is coupled to a second input section of the second PGA 34. A third output section of the gain control logic circuit section 63 is coupled to the input section of the gain update signal generation logic circuit section 64. A first output section of the gain update signal generation logic circuit section 64 is coupled to a second input section of the first ADC 41. A second output section of the gain update signal generation logic circuit section 64 is coupled to a second input section of the second ADC 42. A first output section of the back-end logic circuit section 50 is coupled to the input section of the amplitude detector 61. A second output section of the back-end logic circuit section 50 is coupled to a first input section of the interface section 70. The output section of the amplitude detector 61 is coupled to a first input section of the selector 62. A first output section of the interface section 70 is coupled to a second input section of the selector 62. The output section of the selector 62 is coupled to the input section of the gain control logic circuit section 63. A second output section of the interface section 70 is coupled to the input section of a baseband LSI 90 external to the semiconductor device 1. The output section of the baseband LSI 90 is coupled to a second input section of the interface section 70.

An operation of the semiconductor device 1 shown in FIG. 1A, that is, the adjustment method for the semiconductor device 1 according to the first embodiment, will now be described. First of all, a signal flow from the antenna section 80 to the baseband LSI 90 will be described. The antenna section 80 successively receives a wireless signal. The LNA section 10 amplifies the received signal and outputs the amplified signal to the mixer 20. The mixer 20 synthesizes the amplified signal and a local signal that is generated by a local signal generation section (not shown) and has a desired frequency, and outputs the synthesized signal to the filter section 30. The filter section 30 converts the synthesized signal to an analog signal having desired characteristics, and outputs the resulting analog signal downstream. The ADC section 40, which is coupled downstream of the filter section 30, converts the analog signal to a digital signal and outputs the digital signal to the back-end logic circuit section 50. The back-end logic circuit section 50 performs an arbitrary back-end process on the digital signal and outputs the processed signal to the baseband LSI 90 external to the semiconductor device 1 through the interface section 70 and a digital interface 71. The baseband LSI 90 performs an arbitrary baseband process on the digitally input signal. The back-end process and the baseband process will not be described in further detail because they are not directly related to the present invention.

A feedback to the first and second PGAs 33, 34 will now be described. When a reception level varies at the antenna section 80, an AGC (Automatic Gain Control) function becomes activated. The AGC function exercises control to change the gains of the PGAs so that the input signal levels of the ADCs are within an appropriate range. Thus, the back-end logic circuit section 50 may generate information about a digital signal amplitude and output the generated information to the amplitude detector 61, as described later. In this instance, the amplitude detector 61 generates a first reception level signal indicative of the reception level and outputs the generated signal to the selector 62. Further, the baseband LSI 90 may generate a second reception level signal indicative of the reception level and output the generated signal to the selector 62 through the digital interface 71 and the interface section 70, as described later. The selector 62 selects either the first reception level signal or the second reception level signal and outputs the selected signal to the gain control logic circuit section 63. A mode of operation performed by the semiconductor device 1 when the first reception level signal is selected is called an internal AGC mode or an amplitude detector mode. A mode of operation performed by the semiconductor device 1 when the second reception level signal is selected is called a baseband direct control mode. These two different operation modes can be selected by the selector 62.

In accordance with the first or second reception level signal, the gain control logic circuit section 63 determines whether it is necessary to change the gains of the first and second PGAs 33, 34. If it is necessary to change the gains, the gain control logic circuit section 63 generates a gain setup signal GS and outputs the gain setup signal GS to the first and second PGAs 33, 34. The first and second PGAs 33, 34 set their gains in accordance with the gain setup signal GS. If, for instance, the reception level is higher than a preselected maximum value, the gains of the first and second PGAs 33, 34 are set to be lower than before. If, on the contrary, the reception level is lower than a preselected minimum value, the gains of the first and second PGAs 33, 34 are set to be higher than before. Gain values to be set by the gain setup signal GS may be communicated by directly indicating a gain value or by indicating the difference from a current gain value. In any case, the method of communicating the gain values does not limit the present invention.

A feedback to the ADC section 40 will now be described. When the gain control logic circuit section 63 generates the gain setup signal GS, the gain control logic circuit section 63 notifies, as needed, the gain update signal generation logic circuit section 64 that the first and second PGAs 33, 34 change their gains. In accordance with such a notification, the gain update signal generation logic circuit section 64 generates a gain update signal GU and outputs the generated signal to the ADC section 40. The gain update signal GU plays an important role of indicating a timing at which the first and second PGAs 33, 34 change their gains. However, the details of the gain update signal GU do not limit the present invention. When the ADC section 40 receives the gain update signal GU, calibration is performed for the first and second ADCs 41, 42.

Figure 1B:
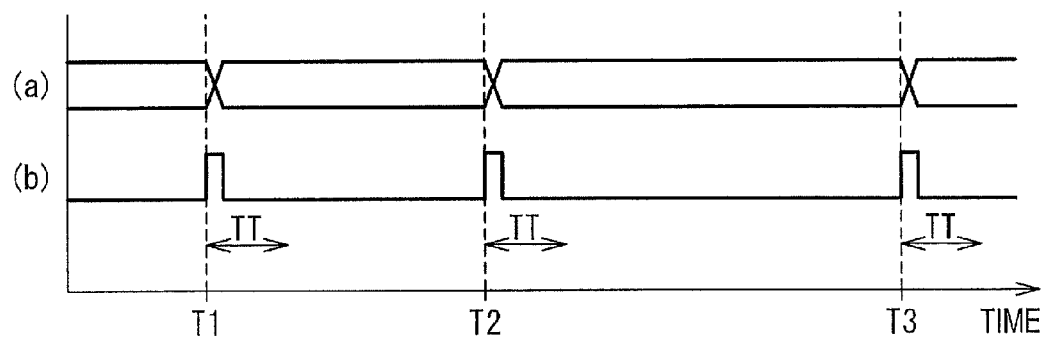
FIG. 1B is a timing diagram illustrating an example of operations performed by structural elements of the semiconductor device shown in FIG. 1A.

A timing at which the ADC section 40 is calibrated will now be described with reference to FIG. 1B. FIG. 1B is a timing diagram illustrating an example of operations performed by structural elements of the semiconductor device 1 shown in FIG. 1A. The timing diagram of FIG. 1B contains a first timing chart a and a second timing chart b. The first timing chart a shows an example of temporal changes in the gain setup signal GS. The second timing chart b shows an example of temporal changes in the gain update signal GU. In the timing charts a, b of FIG. 1B, the horizontal axis represents the elapsed time, whereas the vertical axis represents the intensity of each signal.

A first point of time T, a second point of time T2, and a third point of time T3 are indicated along the horizontal axis shown in FIG. 1B. In the example shown in FIG. 1B, the contents of the gain setup signal GS are changed at the first point of time T1, at the second point of time T2, and at the third point of time T3. Further, the gain update signal GU is generated at the same timing as the changes in the contents of the gain setup signal GS. An elapsed time TT begins to be counted at the same timing as well. The elapsed time TT indicates the time required between the instant at which the first and second PGAs 33, 34 change their gains and the instant at which their output signals become stabilized. In other words, the output signals are unstable and therefore unsuitable for various processes in downstream circuitry during a predetermined period of elapsed time TT after a gain change in the first and second PGAs 33, 34. Therefore, even if the status of the ADC section 40 is changed during the elapsed time TT, it is unlikely that the reception characteristics of the semiconductor device 1 will be significantly affected. Therefore, the present invention makes it possible to calibrate the ADC section 40 after each change in the gains of the first and second PGAs 33, 34.

Figure 2A:
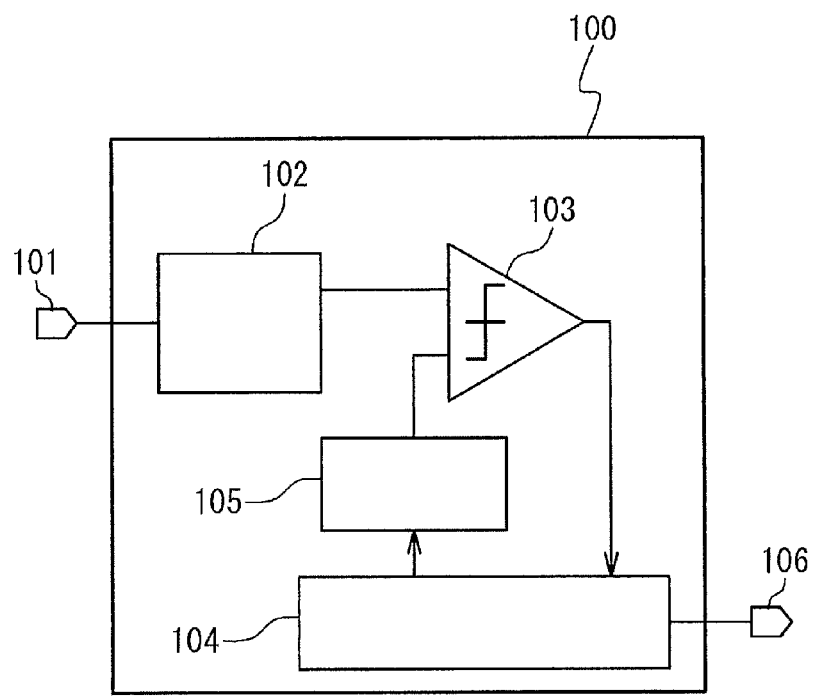
FIG. 2A is a block circuit diagram illustrating an exemplary configuration of an ADC section according to the first embodiment.

Control exercised at the above-described timing to calibrate the ADC section 40 will be described below. FIG. 2A is a block circuit diagram illustrating an exemplary configuration of an ADC 100 according to the first embodiment. The ADC 100 shown in FIG. 2A corresponds to the first ADC 41 or the second ADC 42, which are shown in FIG. 1A.

Structural elements of the ADC 100 shown in FIG. 2A will now be described. The ADC 100 shown in FIG. 2A includes an input section 101, a sample-and-hold circuit section 102, a comparison circuit section 103, a control logic circuit section 104, a DAC (Digital-to-Analog Converter) 105, and an output section 106.

Couplings between the structural elements of the ADC 100 shown in FIG. 2A will now be described. The input section 101 is coupled to the input section of the sample-and-hold circuit section 102. The output section of the sample-and-hold circuit section 102 is coupled to a first input section of the comparison circuit section 103. The output section of the comparison circuit section 103 is coupled to the input section of the control logic circuit section 104. A first output section of the control logic circuit section 104 is coupled to the output section 106. A second output section of the control logic circuit section 104 is coupled to the input section of the DAC. The output section of the DAC 105 is coupled to a second input section of the comparison circuit section 103.

Figure 2B:
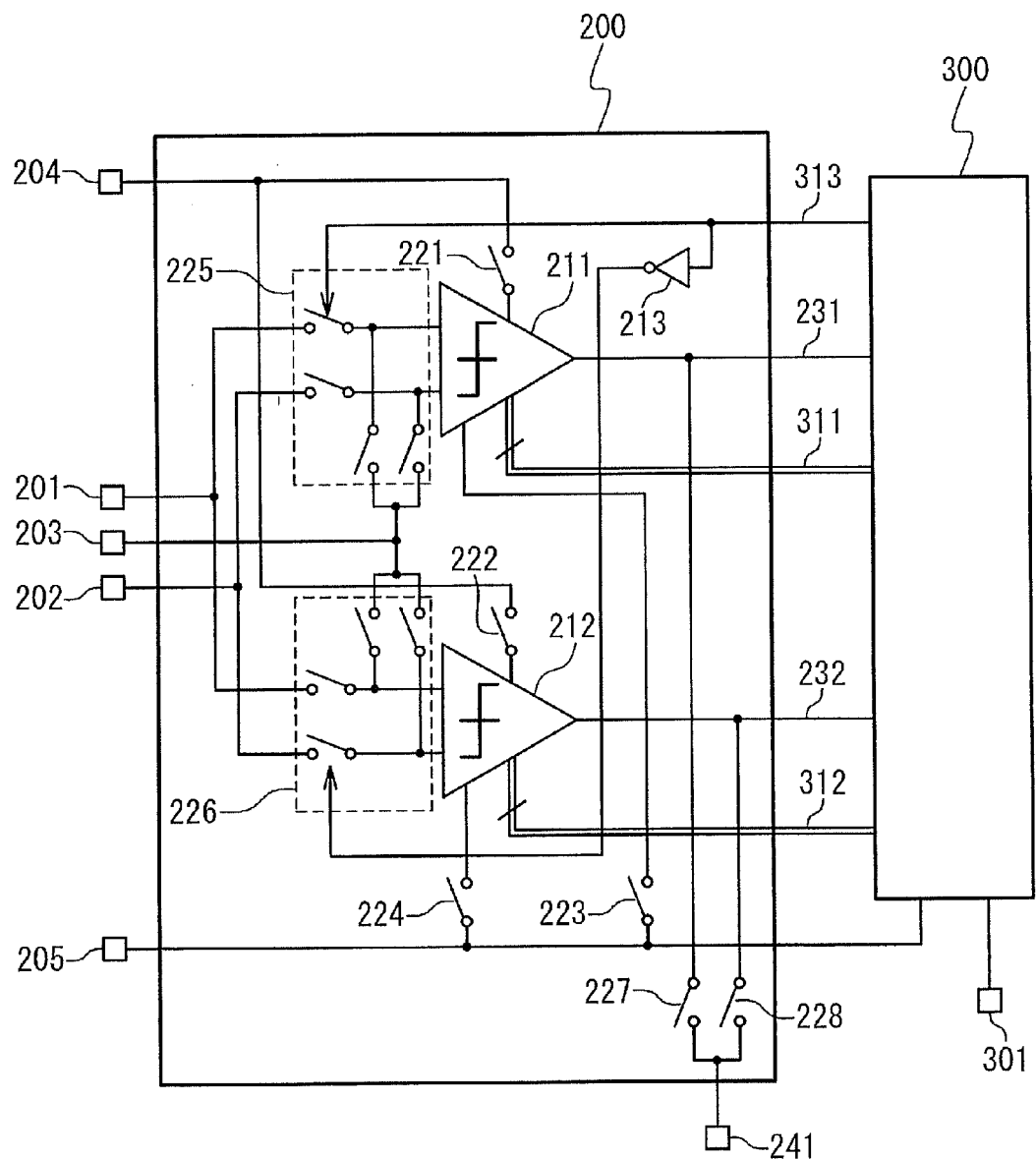
FIG. 2B is a block circuit diagram illustrating an exemplary configuration of a comparison circuit section according to the first embodiment and of a calibration logic circuit section according to the first embodiment.

FIG. 2B is a block circuit diagram illustrating an exemplary configuration of a comparison circuit section 200 according to the first embodiment and of a calibration logic circuit section 300 according to the first embodiment. The comparison circuit section 200 shown in FIG. 2B corresponds to the comparison circuit section 103 shown in FIG. 2A. The calibration logic circuit section 300 shown in FIG. 2B may be included in the semiconductor device 1 shown in FIG. 1A or in the comparison circuit section 103 shown in FIG. 2A.

Structural elements of the comparison circuit section 200 shown in FIG. 2B will now be described. The comparison circuit section 200 shown in FIG. 2B includes a first comparison signal input section 201, a second comparison signal input section 202, a reference voltage input section 203, a clock signal input section 204, a calibration clock signal input section 205, a first comparator 211, a second comparator 212, an inverter 213, a first clock signal switch 221, a second clock signal switch 222, a first calibration clock signal switch 223, a second calibration clock signal switch 224, a first double-pole double-throw switch 225, a second double-pole double-throw switch 226, a first comparison result switch 227, a second comparison result switch 228, a first comparison result signal 231, a second comparison result signal 232, and a comparison result output section 241.

The first and second comparators 211, 212 each include a first signal input section, a second signal input section, a clock signal input section, a calibration clock signal input section, a calibration signal input section, and a comparison result output section. The inverter 213 includes an input section and an output section. The first and second double-pole double-throw switches 225, 226 each include a first common terminal section, a second common terminal section, a first terminal section, a second terminal section, a third terminal section, a fourth terminal section, and a control signal input section.

Structural elements of the calibration logic circuit section 300 shown in FIG. 2B will now be described. The calibration logic circuit section 300 shown in FIG. 2B includes first to fourth input sections and first to third output sections.

Couplings between the structural elements of the comparison circuit section 200 and calibration logic circuit section 300 shown in FIG. 2B will now be described. The first signal input section of the first comparator 211 is coupled to the first common terminal section of the first double-pole double-throw switch 225. The second signal input section of the first comparator 211 is coupled to the second common terminal section of the first double-pole double-throw switch 225. The first terminal section of the first double-pole double-throw switch 225 is coupled to the first comparison signal input section 201. The second terminal section of the first double-pole double-throw switch 225 is coupled to the second comparison signal input section 202. The third and fourth terminal sections of the first double-pole double-throw switch 225 are coupled to the reference voltage input section 203. The clock signal input section of the first comparator 211 is coupled to the clock signal input section 204 through the first clock signal switch 221. The calibration clock signal input section of the first comparator 211 is coupled to the calibration clock signal input section 205 through the first calibration clock signal switch 223. The calibration signal input section of the first comparator 211 is coupled to the first output section of the calibration logic circuit section 300. The comparison result output section of the first comparator 211 is coupled to the first input section of the calibration logic circuit section 300. The comparison result output section of the first comparator 211 is further coupled to the comparison result output section 241 through the first comparison result switch 227.

Similarly, the first signal input section of the second comparator 212 is coupled to the first common terminal section of the second double-pole double-throw switch 226. The second signal input section of the second comparator 212 is coupled to the second common terminal section of the second double-pole double-throw switch 226. The first terminal section of the second double-pole double-throw switch 226 is coupled to the first comparison signal input section 201. The second terminal section of the second double-pole double-throw switch 226 is coupled to the second comparison signal input section 202. The third and fourth terminal sections of the second double-pole double-throw switch 226 are coupled to the reference voltage input section 203. The clock signal input section of the second comparator 212 is coupled to the clock signal input section 204 through the second clock signal switch 222. The calibration clock signal input section of the second comparator 212 is coupled to the calibration clock signal input section 205 through the second calibration clock signal switch 224. The calibration signal input section of the second comparator 212 is coupled to the second output section of the calibration logic circuit section 300. The comparison result output section of the second comparator 212 is coupled to the second input section of the calibration logic circuit section 300. The comparison result output section of the second comparator 212 is further coupled to the comparison result output section 241 through the second comparison result switch 228.

The third input section of the calibration logic circuit section 300 is coupled to the calibration clock signal input section 205. The third output section of the calibration logic circuit section 300 is coupled to the control signal input section of the first double-pole double-throw switch 225. The third output section of the calibration logic circuit section 300 is further coupled to the control signal input section of the second double-pole double-throw switch 226 through the inverter 213.

Figure 2C:
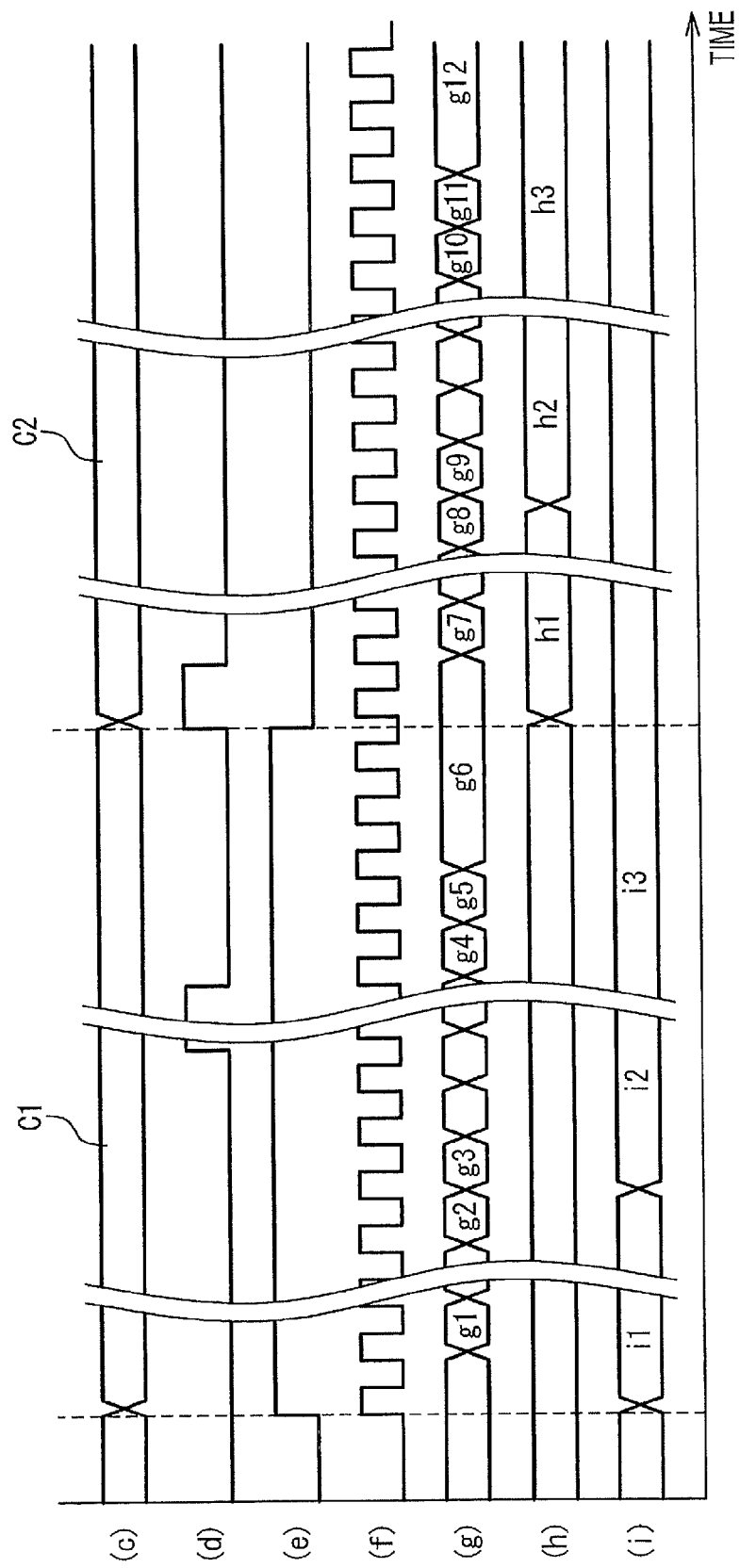
FIG. 2C is a timing diagram illustrating an example of operations performed by structural elements of the semiconductor device shown in FIGS. 2A and 2B.

Operations of the semiconductor device 1 according to the present embodiment will now be described. FIG. 2C is a timing diagram illustrating an example of operations performed by structural elements of the semiconductor device shown in FIGS. 2A and 2B. FIG. 2C contains first to seventh timing charts c-i. The first timing chart c shows an example of temporal changes in calibration status. The second timing chart d shows an example of temporal changes in the gain update signal GU. The third timing chart e shows an example of temporal changes in a selector signal 313. The fourth timing chart f shows an example of temporal changes in a calibration clock signal. The fifth timing chart g shows an example of temporal changes in a comparison result output signal, that is, the first comparison result signal 231 or the second comparison result signal 232. The sixth timing chart h shows an example of temporal changes in a first calibration control signal 311. The seventh timing chart i shows an example of temporal changes in a second calibration control signal 312.

As mentioned earlier, the first or second ADC 41, 42 shown in FIG. 1A corresponds to the ADC 100 shown in FIG. 2A. Further, the comparison circuit section 103 shown in FIG. 2A corresponds to the comparison circuit section 200 shown in FIG. 2B. Therefore, the first ADC 41 includes both the first and second comparators 211, 212 shown in FIG. 2B. In the first ADC 41, the first comparator 211 and the second comparator 212 perform AD conversion and calibration alternately.

Referring to the example shown in FIG. 2C, region c1 in the first timing chart c indicates that the first comparator 211 is performing calibration. During the period represented by region c1, therefore, the second comparator 212 is performing AD conversion. However, it does not matter whether the calibration of the first comparator 211 is completed before the end of the period represented by region c1. In this instance, the first comparator 211 may, for example, pause during the remaining period before the next gain update.

Similarly, region c2, which follows region c1, indicates that the second comparator 212 is performing calibration. During the period represented by region c2, therefore, the first comparator 211 is performing AD conversion. However, it does not matter whether the calibration of the second comparator 212 is completed before the end of the period represented by region c2. In this instance, the second comparator 212 may, for example, pause during the remaining period before the next gain update.

The above is also true for the second ADC 42.

Upon receipt of the gain update signal GU, the comparison circuit sections 103, 200 change the coupling relationship between the first and second comparators 211, 212 so as to perform switching between an AD conversion operation and a calibration operation. More specifically, when the calibration logic circuit section 300 receives the gain update signal GU from a gain update signal input section 301, the calibration logic circuit section 300 switches the status of the selector signal 313 between an "on" state and an "off" state as needed. In the example indicated by the third timing chart e shown in FIG. 2C, the second comparator 212 is performing AD conversion while the selector signal 313 is in the "on" state, and the first comparator 211 is performing AD conversion while the selector signal 313 is in the "off" state.

However, even if the gain update signal GU is received while either the first comparator 211 or the second comparator 212 is being calibrated, the gain update signal GU is ignored or the coupling relationship and the operation are changed after completion of calibration.

The selector signal 313 changes the coupling of the first double-pole double-throw switch 225. Further, after the on/off state is inverted by the inverter 213, the selector signal 313 changes the coupling of the second double-pole double-throw switch 226 as well. Furthermore, the couplings of the first and second clock signal switches 221, 222, of the first and second calibration clock signal switches 223, 224, and of the first and second comparison result switches 227, 228 are controlled and changed as needed by the selector signal 313.

Operations performed by the selector signal 313 to change the couplings of the comparison circuit sections 103, 200 will now be described. During the period represented by region c1, the first double-pole double-throw switch 225 is controlled by the selector signal 313 so that a first common contact is coupled to the third terminal section and further coupled to the reference voltage input section 203 through the third terminal section. Moreover, a second common contact is coupled to the fourth terminal section and further coupled to the reference voltage input section 203 through the fourth terminal section. The first and second terminal sections are then opened.

Further, during the period represented by region c1, the second double-pole double-throw switch 226 is controlled by the selector signal 313 so that the first common contact is coupled to the first terminal section and further coupled to the first comparison signal input section 201 through the first terminal section. Moreover, the second common contact is coupled to the second terminal section and further coupled to the second comparison signal input section 202 through the second terminal section. The third and fourth terminal sections are then opened.

Furthermore, during the period represented by region c1, the second clock signal switch 222, the first calibration clock signal switch 223, and the second comparison result switch 228 are controlled by the selector signal 313 so that they are short-circuited. Moreover, during the period represented by region c1, the second clock signal switch 222, the second calibration clock signal switch 224, and the first comparison result switch 227 are controlled by the selector signal 313 so that they are opened.

During the period represented by region c2, the couplings of all switches controlled by the selector signal 313 are placed in states that are obtained by inverting the above-described states. Therefore, the further details will not be redundantly described.

Operations performed for calibration will now be described in detail. The couplings of the switches are controlled as described above. A comparator that is being calibrated is isolated from the first and second comparison signal input sections to leave AD conversion unaffected. Further, the comparator that is being calibrated receives the calibration clock signal and the calibration control signals 311, 312 in a zero input state in which the same reference voltage is applied to the first and second input sections.

A case where the first comparator 211 is calibrated will now be described. In calibration, the calibration logic circuit section 300 processes the signal 231 that is output from the first comparator 211 in a zero input state. The calibration logic circuit section 300 sets an appropriate value for the first calibration control signal 311 so that the signal 231 output from the first comparator 211 has a determination threshold value in the vicinity of a zero input.

As an algorithm for selecting an appropriate value for the first calibration control signal 311, the calibration logic circuit section 300 should use a binary search method or other convergent algorithm. When the first calibration control signal 311 represents an arbitrary value during the use of the binary search method, the output signal of the comparator to be calibrated is sampled an integer number k of times for accumulation purposes. In this instance, the output signal of the comparator is either 0 or 1. If the resulting cumulative value is greater than k/2, the value of the first calibration control signal 311 is adjusted in the direction of decreasing the comparator offset of the first comparator 211. When this adjustment is repeated an integer i number of times, calibration can be performed with an accuracy equivalent to that of an i-bit binary search.

When the above description is applied to the fifth timing chart g shown in FIG. 2C, the following is obtained. Region g1 represents the output signal of a first sampling in a first step. Region g2 represents the output signal of a kth sampling in the first step. Region g3 represents the output signal of a first sampling in a second step. Region g4 represents the output signal of a k-1th sampling in an ith step. Region g5 represents the output signal of a kth sampling in the ith step. Region g6 represents a pause state of the comparator to be calibrated. Regions g7 to g12 are similar to regions g1 to g6 except that the former regions relate to a case where the second comparator is to be calibrated.

Similarly, when the above description is applied to the seventh timing chart i shown in FIG. 2C, the following is obtained. Region i1 represents the first calibration control signal 311 in the first step. Region i2 represents the first calibration control signal 311 in the second step. Region i3 represents the first calibration control signal 311 in the ith step.

Similarly, when the above description is applied to the sixth timing chart h shown in FIG. 2C, the following is obtained. Region h1 represents the second calibration control signal 312 in the first step. Region h2 represents the second calibration control signal 312 in the second step. Region h3 represents the second calibration control signal 312 in the ith step.

Performing the above-described calibration makes it possible to adjust the offset of the comparators without deteriorating the characteristics of the ADC 100. Adjustments can be made in a typical case to obtain an offset of several millivolts or lower although the value of the adjusted offset may vary with an actually mounted comparator and an implemented offset cancel function.

Further, when, for instance, the gains of the PGAs frequently change, the gain update signal GU need not always be generated each time the gain setup signal GS changes. For example, the gain update signal GU may be successively generated at predetermined intervals. The reason is that environmental factors such as a temperature and a power supply voltage generally change at infrequent intervals of approximately 1 second. Such infrequent intervals are sufficiently longer than intervals of approximately several hundred microseconds at which gain control is exercised. Therefore, even if the gain update signal GU is to be generated at predetermined intervals, the internal circuitry provides a sufficient follow-up speed.

Second Embodiment

As the first embodiment of the present invention, an exemplary calibration of the comparators included in an ADC has been described. As another application example, a method of optimizing the conversion speed and accuracy of an ADC will be described in conjunction with a second embodiment of the present invention.

In general, the operating speed of each element used in a semiconductor integrated circuit varies with factors such as a manufacturing process and an ambient temperature. As such being the case, circuits were previously designed with an adequate operating margin provided. This design method, which was devised to assure proper operations even under the worst conditions, resulted in the consumption of extra electrical power under standard operating conditions and in an increase in the circuit area.

For example, the operating speed of a circuit and the accuracy of signal conversion can be adjusted by changing a bias current, for instance, in an analog circuit of an operational amplifier or by changing a power supply voltage generated, for instance, from an internal regulator in a logic circuit. However, the speed of response to such changes is much lower than the operating speed of an ADC. Therefore, if an attempt is made to make such changes during a circuit operation, the accuracy of AD conversion decreases.

In view of the above circumstances, the second embodiment changes the power supply voltage and bias current at the same timing as for a gain change, as is the case with the first embodiment. This makes it possible to actually prevent the accuracy of reception from being affected by conversion accuracy deterioration and conceal side effects such as accuracy deterioration caused by the above changes.

Figure 3:
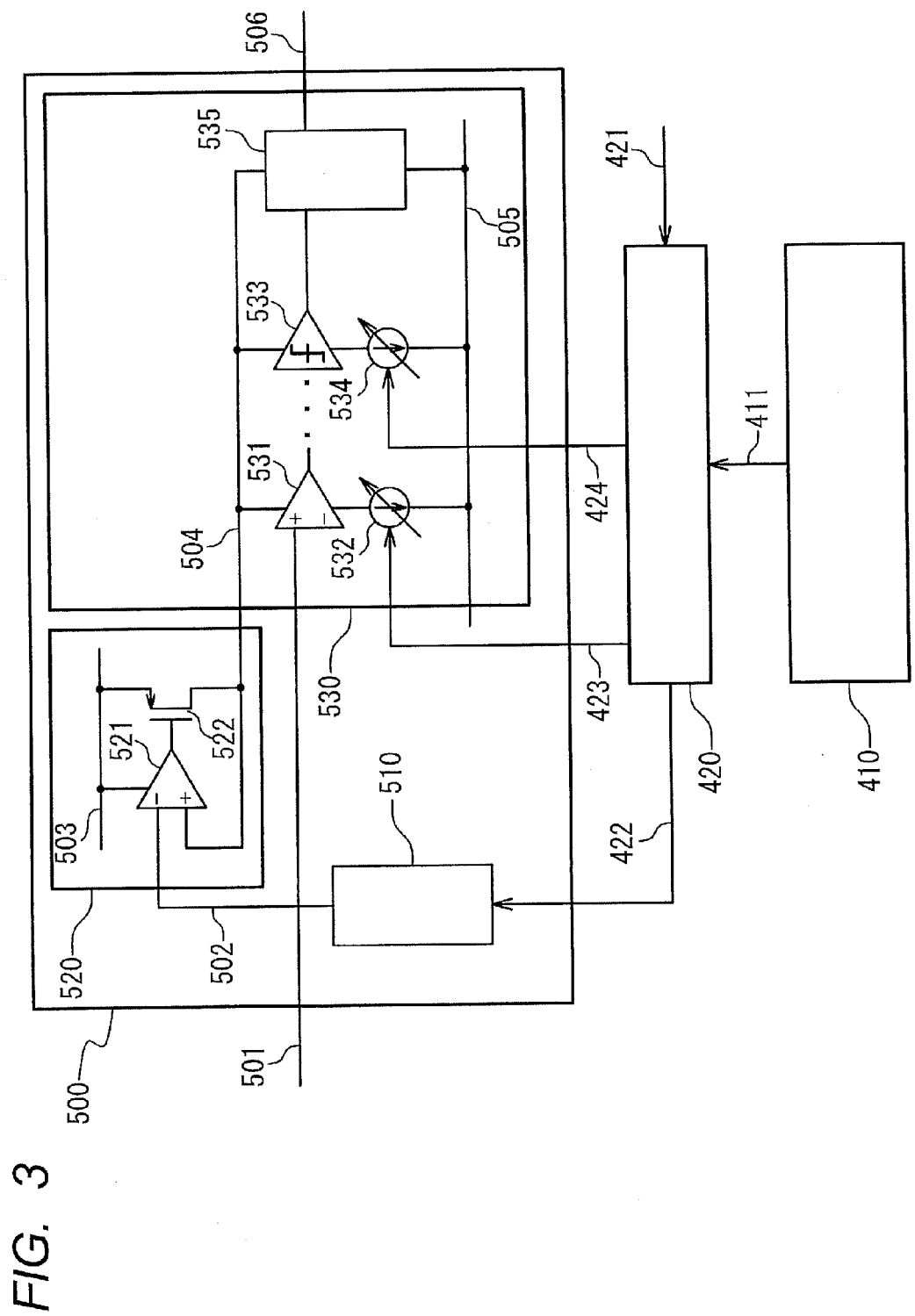
FIG. 3 is a block circuit diagram illustrating the configuration of an ADC according to a second embodiment of the present invention.

FIG. 3 is a block circuit diagram illustrating the configuration of an ADC 500 according to the second embodiment. Structural elements of the ADC 500 shown in FIG. 3 will now be described. The ADC 500 shown in FIG. 3 includes an ADC input section 501, a reference voltage control circuit section 510, a regulator circuit section 520, an internal ADC circuit section 530, and an ADC output section 506.

The regulator circuit section 520 includes an amplifier 521 and a transistor 522. In the example shown in FIG. 3, it is assumed that a P-channel FET (Field Effect Transistor) is as the transistor 522. The internal ADC circuit section 530 includes an amplifier 531, a first bias current source 532, a comparator 533, a second bias current source 534, and an internal logic circuit section 535.

The couplings of the structural elements of the ADC 500 shown in FIG. 3 will now be described. In the outside of the ADC 500, the output section of a monitor circuit section 410 is coupled to a first input section of a control logic circuit section 420. It is assumed that a second input section of the control logic circuit section 420 is coupled, for instance, to the output section of the gain update signal generation logic circuit section 64 according to the first embodiment. A first output section of the control logic circuit section 420 is coupled to the input section of the reference voltage control circuit section 510. A second output section of the control logic circuit section 420 is coupled to a control signal input section of the first bias current source 532. A third output section of the control logic circuit section 420 is coupled to a control signal input section of the second bias current source 534. The output section of the reference voltage control circuit section 510 is coupled to an inverting input section of the amplifier 521. A power supply input section of the amplifier 521 is coupled to a first power supply 503. It is assumed that a second power supply input section (not shown) of the amplifier 521 is coupled to a second power supply 505. The source of the transistor 522 is coupled to the first power supply 503. The gate of the transistor 522 is coupled to the output section of the amplifier 521. The drain of the transistor 522 is common-coupled to a noninverting input section of the amplifier 521, to a first power supply input section of the amplifier 531, to a first power supply input section of the comparator 533, and to a first power supply input section of the internal logic circuit section 535. A second power supply input section of the amplifier 531 is coupled to the second power supply 505 through the first bias current source 532. A second power supply input section of the comparator 533 is coupled to the second power supply 505 through the second bias current source 534. A second power supply input section of the internal logic circuit section 535 is coupled to the second power supply 505. The ADC input section 501 is coupled to the input section of the amplifier 531. The input section of the comparator 533 is coupled downstream of the output section of the amplifier 531. The output section of the comparator 533 is coupled to the input section of the internal logic circuit section 535. The output section of the internal logic circuit section 535 is coupled to the ADC output section 506.

Operations performed by the ADC 500, the monitor circuit section 410, and the control logic circuit section 420, which are shown in FIG. 3, will now be described. The monitor circuit section 410 detects the characteristics, for instance, of a manufacturing process, power supply voltage, and temperature, generates a characteristics signal 411 indicative of the result of detection, and outputs the generated signal 411 to the control logic circuit section 420. The control logic circuit section 420 generates a reference voltage control signal 422, a first bias current control signal 423, and a second bias current control signal 424 in accordance with the characteristics signal 411 and with a gain update signal 421. The control logic circuit section 420 outputs the reference voltage control signal 422 to the reference voltage control circuit section 510 to control its operation. The control logic circuit section 420 outputs the first bias current control signal 423 to the first bias current source 532 to control its operation. The control logic circuit section 420 outputs the second bias current control signal 424 to the second bias current source 533 to control its operation. The reference voltage control circuit section 510 generates a reference voltage 502 and outputs it to the regulator circuit section 520 to control its operation. The regulator circuit section 520 generates an internal power supply voltage 504 in accordance with the reference voltage 502. The internal ADC circuit section 530 receives the internal power supply voltage 504 and performs AD conversion.

Figure 4:
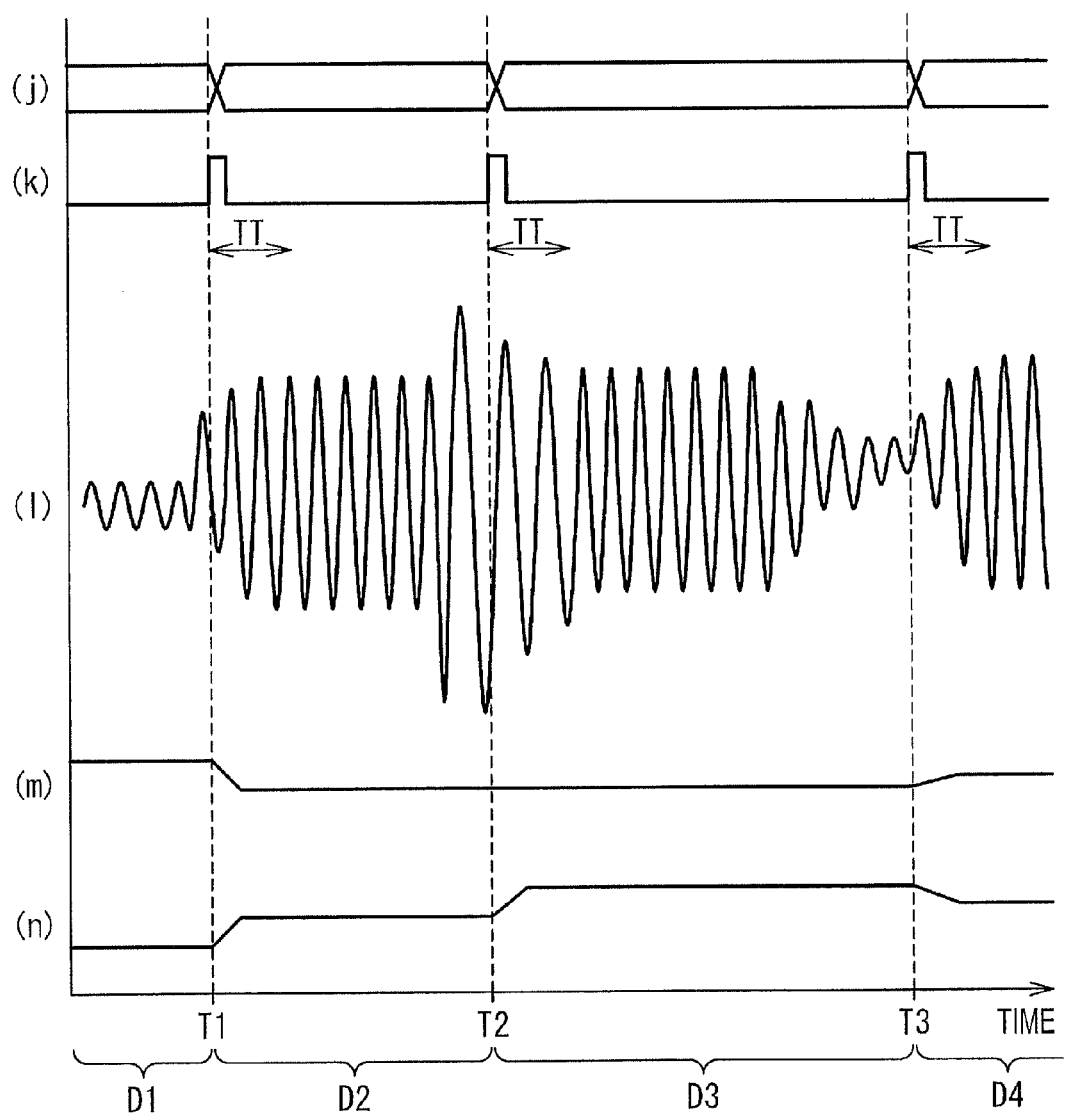
FIG. 4 is a timing diagram illustrating an example of operations performed by structural elements of the ADC according to the second embodiment.

FIG. 4 is a timing diagram illustrating an example of operations performed by structural elements of the ADC 500 according to the second embodiment. FIG. 4 contains first to fifth timing charts j-n. The first timing chart j shows an example of temporal changes in the gain setup signal GS. The second timing chart k shows an example of temporal changes in the gain update signal 421. The third timing chart l shows an example of temporal changes in an ADC input signal. The fourth timing chart m shows an example of temporal changes in the internal power supply voltage 504. The fifth timing chart n shows an example of temporal changes in a bias current that flows in the first or second bias current source 532, 534. In the first to fifth timing charts j-n, the horizontal axis represents the elapsed time, whereas the vertical axis represents the intensity of each signal.

For explanation purposes, a first point of time T1, a second point of time T2, and a third point of time T3 are defined along the elapsed time within the timing diagram of FIG. 4. A period preceding the first point of time T1 is referred to as a first period D1. A period between the first point of time T1 and the second point of time T2 is referred to as a second period D2. A period between the second point of time T2 and the third point of time T3 is referred to as a third period D3. A period succeeding the third point of time T3 is referred to as a fourth period D4.

As is the case with the first embodiment, if the amplitude of the ADC input signal is detected to be unduly small during the first period D1, the second embodiment changes the gain setup signal GS at the first point of time T1 to generate the gain update signal 421. As a result, the amplitude of the ADC input signal is adjusted within a desired range during a transition time TT. Further, the second embodiment adjusts the internal power supply voltage 504 and the bias current as needed at the first point of time T1.

If the amplitude of the ADC input signal is detected to be unduly large during the latter half of the second period D2, the gain setup signal GS is changed at the second point of time t2 to generate the gain update signal 421. As a result, the amplitude of the ADC input signal is adjusted within a desired range during the transition time TT. Further, the bias current is adjusted as needed. However, the internal power supply voltage 504 need not always be changed.

The internal power supply voltage 504 and the bias current are successively adjusted after the third point of time T3. In any case, the adjustments are made at a timing at which a PGA gain update is performed, as is the case with the first embodiment.

Common ADCs include, for example, an analog amplifier, a comparator, and an internal logic circuit section although the detailed configuration of the common ADCs depends on an employed AD conversion method. These structural elements are designed with an adequate margin provided in terms of the internal power supply voltage 504 and of the bias current in order to ensure that they are fully operable even if a manufacturing process, an operating ambient temperature, or other relevant factor varies.

To minimize the power consumption and footprint of an ADC, it is necessary to use a mechanism that adjusts the internal power supply voltage 504 and the bias current as needed in accordance with the variations of the manufacturing process and ambient temperature. Predetermined transition time appropriate for circuit configuration is required for making such adjustments. Consequently, as is the case with the first embodiment, the second embodiment makes it possible to conceal a relevant response by making the adjustments at a timing at which a PGA gain is changed.

Third Embodiment

The mechanism provided by the present invention is applicable not only to the calibration and performance adjustment of an ADC but also to the calibration and characteristics adjustment of internal circuits of an RFIC, which is required to perform successive reception operations. As for such internal circuits, for example, the gain of an LNA, the distortion of a mixer, the DC (Direct Current) offset of a PGA, the cutoff frequency of a filter, and the filtering characteristics of a digital filter disposed downstream of an ADC are to be calibrated.

If a DC offset exists particularly in a direct conversion receiver circuit, the dynamic range of the circuit may be exceeded when a signal is amplified by the PGA or the digital filter. Therefore, it is necessary to eliminate the DC offset. In such an instance, the DC offset is eliminated in accordance with a preselected gain. Therefore, the DC offset may be calibrated in each sub-block. In such a case, too, it is possible to prevent the accuracy of reception from deteriorating by initiating a calibration operation by using the gain update signal GU as a trigger.

Fourth Embodiment

As a fourth embodiment of the present invention, its application to a wireless communication system used, for instance, for mobile phones will now be described. Present-day wireless communication systems are extremely large-scaled and complex due, for instance, to the use of diversified communication methods and the implementation of broadband communication. The inside of an RFIC is also highly integrated and highly functional to cope with the above-mentioned changes. The fourth embodiment will be described in conjunction with an RFIC having the functions of elements that were previously external to the RFIC. More specifically, the RFIC functionally incorporates a balun, an inductor, or other passive element and a SAW (Surface Acoustic Wave) filter. It is assumed that a wireless communication system according to the fourth embodiment includes the above-described RFIC, a front-end module coupled to the outside of the RFIC, a transmission power amplifier, a duplexer, an RFIC, a power supply management IC, and a digital baseband processor.

Figure 5:
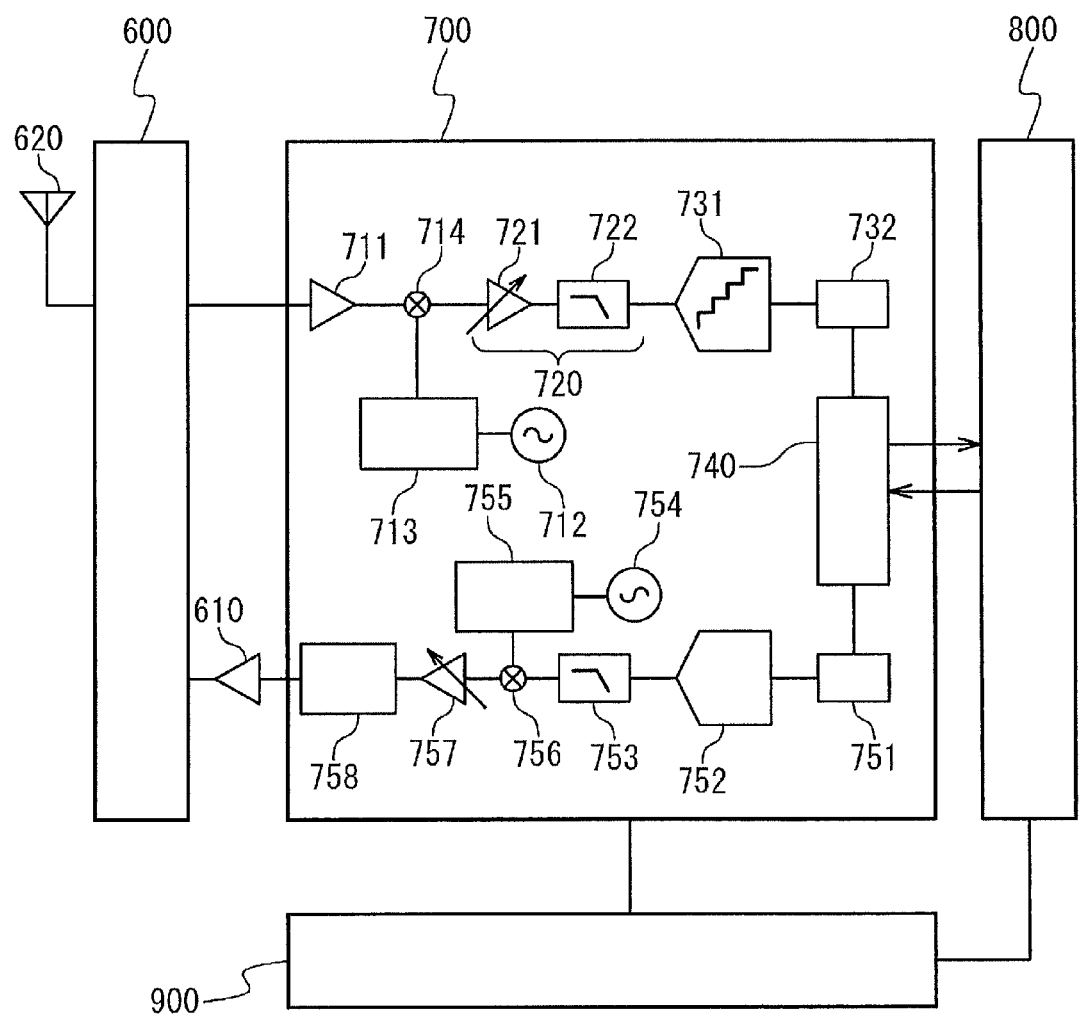
FIG. 5 is a block circuit diagram illustrating the configuration of a wireless communication system according to a fourth embodiment of the present invention.

FIG. 5 is a block circuit diagram illustrating the configuration of the wireless communication system according to the fourth embodiment. Structural elements of the wireless communication system shown in FIG. 5 will now be described. The wireless communication system shown in FIG. 5 includes a front-end module 600, a transmission power amplifier 610, an antenna 620, a semiconductor device 700, a digital baseband processor 800, and a power supply management IC 900.

The semiconductor device 700 includes an LNA 711, a reception-side local frequency generation section 712, a reception-side frequency divider 713, a reception-side mixer 714, an N stage 720, an ADC 731, a digital filter 732, an interface section 740, a transmission-side logic circuit section 751, a DAC 752, a transmission-side filter 753, a transmission-side local frequency generation section 754, a transmission-side frequency divider 755, a transmission-side mixer 756, a transmission-side PGA 757, and a balun 758. It should be noted that a duplexer is not shown in the figure.

The N stage 720 includes a reception-side PGA 721 and a reception-side filter 722.

Couplings of the structural elements of the wireless communication system shown in FIG. 5 will now be described. The antenna 620 is coupled to the input/output section of the front-end module 600. The output section of the front-end module 600 is coupled to the input section of the LNA 711. The output section of the LNA 711 is coupled to a first input section of the reception-side mixer 714. The output section of the reception-side local frequency generation section 712 is coupled to the input section of the reception-side frequency divider 713. The output section of the reception-side frequency divider 713 is coupled to a second input section of the reception-side mixer 714. The output section of the reception-side mixer 714 is coupled to the input section of the reception-side PGA 721. The output section of the reception-side PGA 721 is coupled to the input section of the reception-side filter 722. The output section of the reception-side filter 722 is coupled to the input section of the ADC 731. The output section of the ADC 731 is coupled to the input section of the digital filter 732. The output section of the digital filter 732 is coupled to the input section of the interface section 740. The input/output section of the interface section 740 is coupled to the input/output section of the digital baseband processor 800. The output section of the interface section 740 is coupled to the input section of the transmission-side logic circuit section 751. The output section of the transmission-side logic circuit section 751 is coupled to the input section of the DAC 752. The output section of the DAC 752 is coupled to the input section of the transmission-side filter 753. The output section of the transmission-side filter 753 is coupled to a first input section of the transmission-side mixer 756. The output section of the transmission-side local frequency generation section 754 is coupled to the input section of the transmission-side frequency divider 755. The output section of the transmission-side frequency divider 755 is coupled to a second input section of the transmission-side mixer 756. The output section of the transmission-side mixer 756 is coupled to the input section of the transmission-side PGA 757. The output section of the transmission-side PGA 757 is coupled to the input section of the balun 758. The output section of the balun 758 is coupled to the input section of the transmission power amplifier 610. The output section of the transmission power amplifier 610 is coupled to the input section of the front-end module 600. The power supply management IC 900 is coupled to the semiconductor device 700 and to the digital baseband processor 800.

The wireless communication system shown in FIG. 5 includes one antenna 620, one reception system, and one transmission system. As is the case with the first embodiment, which includes one antenna and one reception system, the present invention can also be applied to a transmission system operation. Further, the present invention is similarly applicable to a common wireless communication system such as a MIMO (Multi-Input Multi-Output) wireless communication system having a plurality of antennas and a plurality of transmission/reception systems.

Fifth Embodiment

As a fifth embodiment of the present invention, its application to a case where a flash ADC is used as the ADCs 41, 42 shown in FIGS. 1A and 1B will now be described. To acquire n ADC output levels, a common flash ADC uses n−1 comparators. The n−1 comparators compare an input voltage $V_{IN}$ to n−1 reference voltages $V_0$-$V_{n-2}$ to acquire n−1 output signals $CO_0$-$CO_{n-2}$. The n−1 output signals $CO_0$-$CO_{n-2}$ may be referred to as thermometer codes.

When one or more extra comparators are added to the n−1 comparators, comparator background calibration can be performed alternately. If, in this instance, switching between a comparison operation and a calibration operation is performed at fixed intervals, an unnecessary signal component having a frequency corresponding to the cycle of such switching is generated as described in conjunction with the first embodiment.

The fifth embodiment can avoid the generation of such an unnecessary signal component by using the gain update signal GU to change a target comparator, which is to be calibrated, at a timing at which a gain change is made. In other words, it is preferred that a flash ADC be used for a reception method that performs successive operations.

Figure 6A:
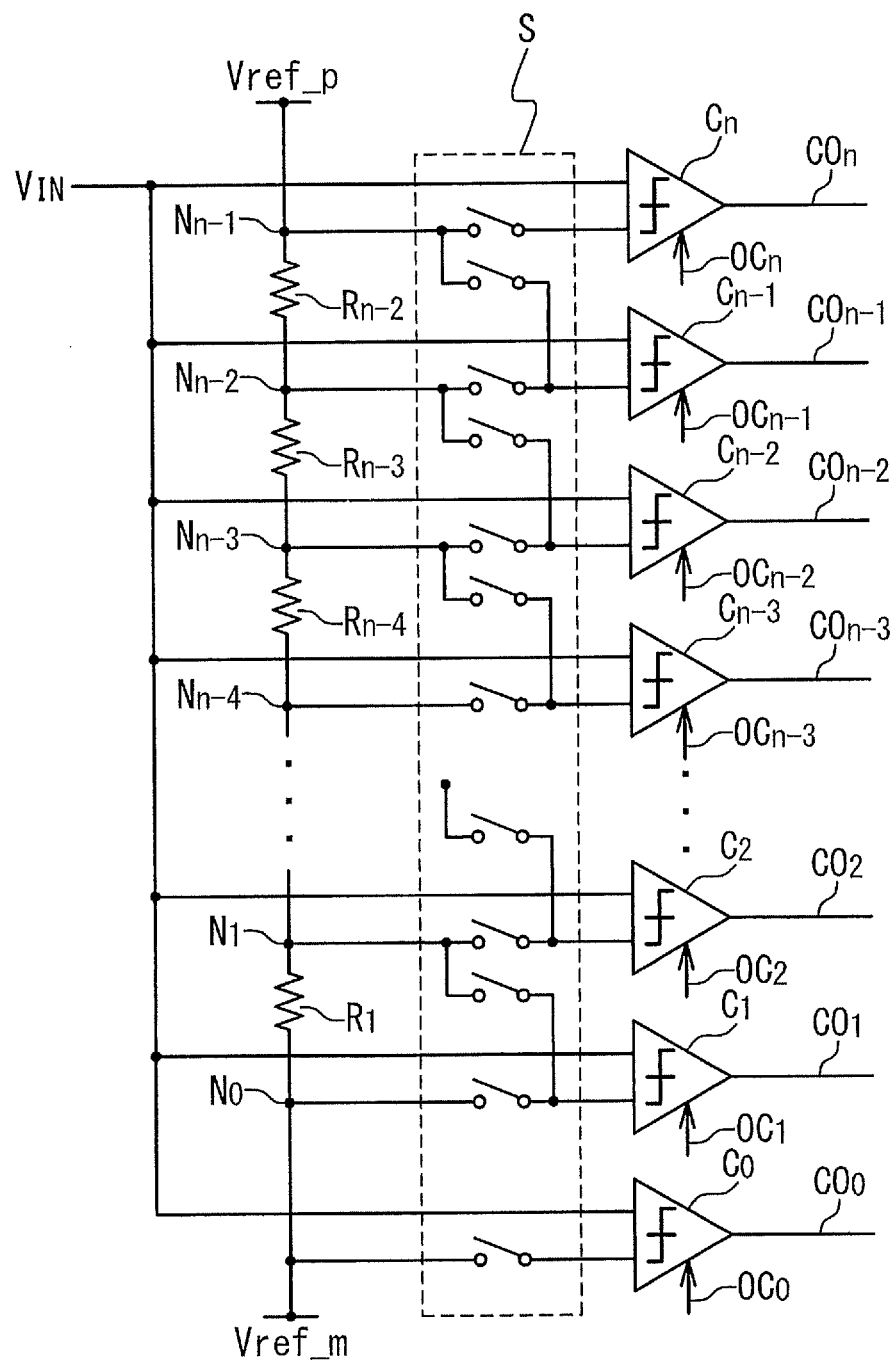
FIG. 6A is a block circuit diagram illustrating the configuration of a flash ADC according to a fifth embodiment of the present invention.

FIG. 6A is a block circuit diagram illustrating the configuration of a flash ADC according to the fifth embodiment. Structural elements of the flash ADC shown in FIG. 6A will now be described. The flash ADC shown in FIG. 6A includes N+1 comparators $C_0$-$C_N$, N−1 nodes $N_0$-$N_{n-1}$, N−2 resistors $R_1$-$R_{n-2}$, and switches S.

Couplings of the structural elements of the flash ADC shown in FIG. 6A will now be described. The N−2 resistors $R_1$-$R_{n-2}$ are coupled in series. The ends and coupling joints of the N−2 resistors $R_1$-$R_{n-2}$ are referred to as the N−1 nodes $N_0$-$N_{n-1}$. The input section for an input voltage VIN is coupled to one input section of each of the N+1 comparators $C_0$-$C_N$, whereas one of the N−1 nodes $N_0$-$N_{n-1}$ is coupled to the other input section of each of the N+1 comparators $C_0$-$C_N$ through the switches S.

Operations performed by the flash ADC shown in FIG. 6A will now be described. A first reference voltage Vref_p and a second reference voltage Vref_m are applied across the N−2 resistors $R_1$-$R_{n-2}$ coupled in series. The resulting potential difference is voltage-divided and output from the N−1 nodes $N_0$-$N_{n-1}$. Two extra comparators are provided so that N−1 comparators subject an input signal to AD conversion in accordance with offset control signals $OC_0$-$OC_n$ while one comparator performs background calibration. The background calibration is performed at a timing at which a gain change is made, as is the case with the first embodiment. The comparator $C_0$ is used for AD conversion only when the comparator $C_1$ is being calibrated, and not used when the other comparators $C_2$-$C_N$ are being calibrated.

Figure 6B:
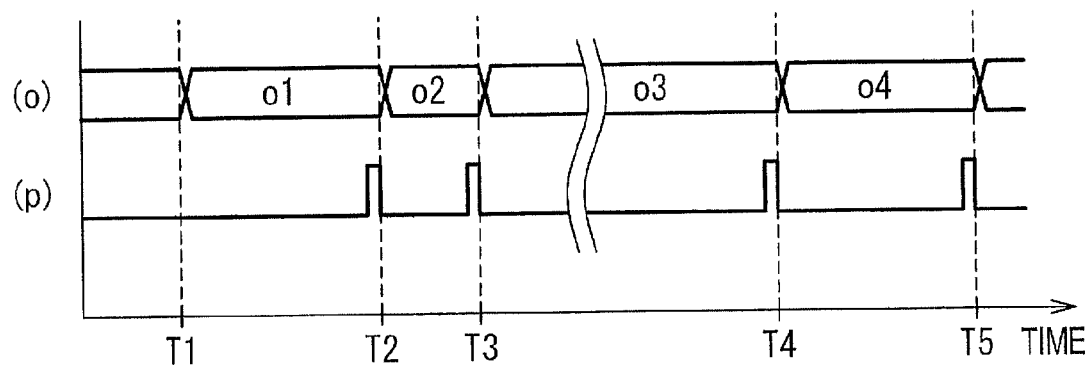
FIG. 6B is a timing diagram illustrating an exemplary selection operation for a comparator to be calibrated in the flash ADC according to the fifth embodiment.

The order in which the comparators are selected is not specifically defined and does not limit the present invention. As an example, a case where the comparators are selected in ascending order will now be described. FIG. 6B is a timing diagram illustrating an exemplary selection operation for the comparator to be calibrated in the flash ADC according to the fifth embodiment. The timing diagram of FIG. 6B contains a first timing chart o and a second timing chart p. The first timing chart o a shows temporal changes in the comparator to be calibrated. The second timing chart b shows temporal changes in the gain update signal GU. In FIG. 6B, the horizontal axis represents the elapsed time.

In the example shown in FIG. 6B, the calibration of the zeroth comparator $C_0$ starts a first point of time T1. In this instance, the gain update signal GU is not generated. This is a calibration included in a circuit's initial operation. At a second point of time T2, the calibration of the first comparator $C_1$ starts upon the generation of the gain update signal GU. Likewise, at a third point of time T3, the calibration of the second comparator $C_2$ starts upon the generation of the gain update signal GU. Similarly, the comparator to be calibrated successively changes upon the generation of the gain update signal GU. Then, at a fourth point of time T4, the comparator $C_0$ is calibrated after the calibration of the last comparator $C_n$. Subsequently, the above-described sequence is repeated.

Sixth Embodiment

A sixth embodiment of the present invention will now be described. The first to fifth embodiments have been described in conjunction with a method of calibrating a circuit section irrelevant to a PGA gain change in synchronism with the PGA gain change. The sixth embodiment provides the same advantages as the first to fifth embodiments even when calibration is performed in synchronism with a reception channel change instead of a PGA gain change.

In the first embodiment, after the frequency of a local signal is changed in accordance with a desired channel to be demodulated, the mixer 20 shown in FIG. 1 multiplies the local signal by an RF signal received from the antenna section 80. It is assumed that the local signal is generated by a PLL (Phase Locked Loop) circuit built in an RFIC. When the frequency of the local signal is to be changed, the time required for a transition from the current frequency to a changed frequency is, in general, relatively long, namely, from several tens of microseconds to several hundred microseconds. During this transition period during which the PLL circuit is locked up, no significant information transmission takes place. The reason is that communications are not normal during such a transition period. Therefore, no problem arises with successive reception even if the circuit section to be calibrated is changed as described in conjunction with the first to fifth embodiments during the local signal frequency transition period.

Figure 7A:
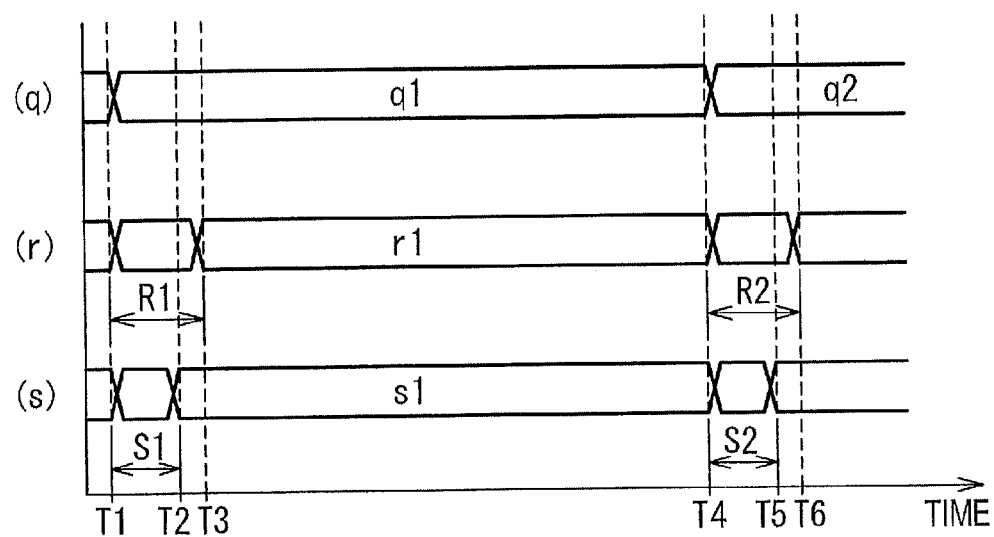
FIG. 7A is a timing diagram illustrating an example of operations performed by structural elements of the semiconductor device according to a sixth embodiment of the present invention.

FIG. 7A is a timing diagram illustrating an example of operations performed by structural elements of the semiconductor device according to the sixth embodiment. The timing diagram of FIG. 7A contains first to third timing charts q-s. The first timing chart q shows how a reception channel is changed. The second timing chart r shows the status of the PLL circuit. The third timing chart s shows the status of calibration. In FIG. 7A, the horizontal axis represents the elapsed time. First to sixth points of time T1-T6 are sequentially defined along the elapsed time.

In the first timing chart q, region q1, which is between the first point of time T1 and the fourth point of time T4, indicates that a first reception channel is selected. Region q2, which is subsequent to the fourth point of time T4, indicates that a second reception channel is selected. In the second timing chart r, period R1, which is between the first point of time T1 and the third point of time T3, and period R2, which is between the fourth point of time T4 and the sixth point of time T6, both indicate that the PLL circuit is locked up. Region r1, which is between the third point of time T3 and the fourth point of time T4, indicates that the PLL circuit is locked. In the third timing chart s, period S1, which is between the first point of time T1 and the second point of time T2, and period S2, which is between the fourth point of time T4 and the fifth point of time T5, both indicate that the reception channel is being changed, and that a desired circuit section is calibrated.

Further, after a reception channel change, gain control is often exercised under normal conditions. In such an instance, calibration can be performed without affecting reception operations by using the gain update signal GU used in the first to fifth embodiments as a trigger.

Figure 7B:
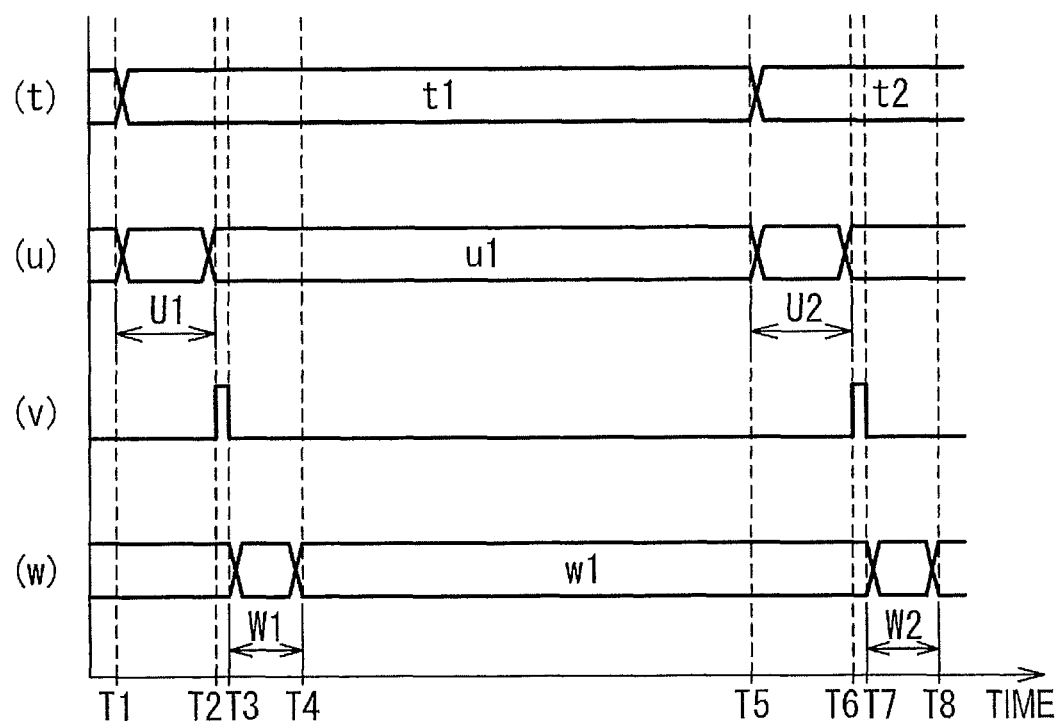
FIG. 7B is a timing diagram illustrating another example of operations performed by structural elements of the semiconductor device according to the sixth embodiment.

FIG. 7B is a timing diagram illustrating another example of operations performed by structural elements of the semiconductor device according to the sixth embodiment. The timing diagram of FIG. 7B contains first to fourth timing charts t-w. The first timing chart t shows how the reception channel is changed. The second timing chart u shows the status of the PLL circuit. The third timing chart v shows temporal changes in the gain update signal GU. The fourth timing chart w shows the status of calibration. In FIG. 7B, the horizontal axis represents the elapsed time. First to eighth points of time T1-T8 are sequentially defined along the elapsed time.

In the first timing chart t, region t1, which is between the first point of time T1 and the fifth point of time T5, indicates that a first reception channel is selected. Region t2, which is subsequent to the fifth point of time T5, indicates that a second reception channel is selected. In the second timing chart u, period U1, which is between the first point of time T1 and the second point of time T2, and period U2, which is between the fifth point of time T5 and the sixth point of time T6, both indicate that the PLL circuit is locked up. Region u1, which is between the second point of time T2 and the fifth point of time T5, indicates that the PLL circuit is locked. In the third timing chart v, a period between the second point of time T2 and the third point of time T3 and a period between the sixth point of time T6 and the seventh point of time T7 both indicate that the gain update signal GU is generated and output. In the fourth timing chart w, period W1, which is between the third point of time T3 and the fourth point of time T4, and period W2, which is between the seventh point of time T7 and the eighth point of time T8, both indicate that a desired circuit section is calibrated.

The circuit sections according to the first to sixth embodiments, which have been described above, may be freely combined as far as they do not introduce technical inconsistency.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device comprising:
a communication circuit section that performs a reception operation;
a detection circuit section that detects an occurrence of an invalid received signal during the reception operation; and
an adjustment circuit section that adjusts characteristics of the communication circuit section,
wherein the adjustment circuit section makes the adjustment at a timing at which the invalid received signal occurs, and
wherein the communication circuit section includes a first comparator in which the characteristics of the communication circuit section are adjusted.

2. The semiconductor device according to claim 1,
wherein the communication circuit section includes a variable gain amplifier having a reception gain set by a reception gain setup signal, and
wherein the detection circuit section detects the occurrence of the invalid received signal from a change in the reception gain of the variable gain amplifier and notifies the adjustment circuit section of the occurrence of the invalid received signal.

3. The semiconductor device according to claim 1,
wherein the communication circuit section includes a variable frequency oscillator that changes an oscillation frequency in accordance with a reception channel, and
wherein the detection circuit section detects the occurrence of the invalid received signal from a change in the oscillation frequency of the variable frequency oscillator and notifies the adjustment circuit section of the occurrence of the invalid received signal.

4. The semiconductor device according to claim 1,
wherein the communication circuit section includes a second comparator that performs the reception operation, and a control circuit section that switches between the first comparator and the second comparator at a timing at which the invalid received signal occurs, and
wherein the adjustment circuit section includes a calibration logic circuit that performs offset calibration of the first or second comparator in order to adjust the characteristics.

5. The semiconductor device according to claim 4, wherein the communication circuit section includes a charge-sharing successive approximation ADC (Analog-to-Digital Converter) that is provided with the first and second comparators.

6. The semiconductor device according to claim 4, wherein the communication circuit section includes a flash ADC that is provided with the first and second comparators.

7. The semiconductor device according to claim 1, wherein the communication circuit section includes a bias current source that supplies a bias current, and
wherein the adjustment circuit section includes a control circuit section that adjusts the bias current.

8. The semiconductor device according to claim 1,
wherein the communication circuit section includes a regulator circuit section that supplies an internal power supply voltage, and
wherein the adjustment circuit section includes a control circuit section that adjusts the internal power supply voltage.

9. The semiconductor device according to claim 1,
wherein the communication circuit section includes a filter section that performs a gain adjustment process on a received signal, and
wherein the adjustment circuit section includes a control circuit section that calibrates a DC (Direct Current) offset, which affects the gain adjustment process.

10. The semiconductor device according to claim 1, wherein the communication circuit section includes a filter section that filters a received signal, and
wherein the adjustment circuit section includes a control circuit section that calibrates the cutoff frequency of the filter section.

11. The semiconductor device according to claim 1,
wherein the communication circuit section includes a mixer that synthesizes a received signal and a local signal having a desired frequency, and
wherein the adjustment circuit section includes a control circuit section that performs calibration to suppress the distortion of the mixer.

12. The semiconductor device according to claim 1,
wherein the communication circuit section includes an LNA (Low Noise Amplifier) that amplifies a received signal, and
wherein the adjustment circuit section includes a control circuit section that performs calibration to adjust the gain of the LNA.

13. A semiconductor device adjustment method comprising:
causing a communication circuit section to perform a reception operation;
detecting the occurrence of an invalid received signal during the reception operation; and
adjusting characteristics of the communication circuit section through a first comparator,
wherein the adjusting includes making the adjustment of characteristics of the communication circuit section through the first comparator at a timing at which the invalid received signal occurs,
wherein the communication circuit section includes a variable frequency oscillator that changes an oscillation frequency in accordance with a reception channel,
wherein the detecting further comprising of detecting the occurrence of the invalid received signal from a change in the oscillation frequency of the variable frequency oscillator and notifies the adjustment circuit section of the occurrence of the invalid received signal, and
wherein the communication circuit section includes a second comparator that performs the reception operation, and a control circuit section that switches between the first comparator and the second comparator at a timing at which the invalid received signal occurs; and
further comprising performing offset calibration of the first or second comparator in order to adjust the characteristics.

14. The semiconductor device adjustment method according to claim 13, wherein the detecting includes detecting the occurrence of the invalid received signal from a reception gain change.

15. The semiconductor device adjustment method according to claim 13, wherein the detecting includes detecting the occurrence of the invalid received signal from a reception channel change.

16. The semiconductor device according to claim 1, wherein the adjustment circuit comprises:
a plurality of comparators in which the characteristics are adjusted;
a charge-sharing successive approximation ADC (Analog-to-Digital Converter) that is provided with the plurality of comparators, and
wherein the adjustment circuit section makes the adjustment at the timing at which the invalid received signal occurs including calibrating to adjust the offset of the comparators without changing the characteristics of the ADC.

17. The semiconductor device according to claim 1, wherein the detection circuit section detects the occurrence of the invalid received signal from a change in the reception gain and notifies the adjustment circuit section of the occurrence of the invalid received signal.

18. The semiconductor device according to claim 1, wherein the detection circuit section detects the occurrence of the invalid received signal from a change in an oscillation frequency and notifies the adjustment circuit section of the occurrence of the invalid received signal.

19. The semiconductor device adjustment method according to claim 13, wherein the communication circuit section includes a variable gain amplifier whose reception gain is set by a reception gain setup signal, and
wherein the detecting further comprising of detecting the occurrence of the invalid received signal from a change in the reception gain of the variable gain amplifier and notifies the adjustment circuit section of the occurrence of the invalid received signal.

* * * * *